US010812299B2

(12) United States Patent
Mejri et al.

(10) Patent No.: US 10,812,299 B2
(45) Date of Patent: Oct. 20, 2020

(54) ANTICIPATED TERMINATION FOR SEQUENTIAL DECODERS

(71) Applicant: INSTITUT MINES-TELECOM, Paris (FR)

(72) Inventors: Asma Mejri, Antibes (FR); Ghaya Rekaya-Ben Othman, Antony (FR)

(73) Assignee: INSTITUT MINES-TELECOM, Paris (FR)

( * ) Notice: Subject to any disclaimer, the term of this patent is extended or adjusted under 35 U.S.C. 154(b) by 9 days.

(21) Appl. No.: 15/580,096

(22) PCT Filed: Jun. 7, 2016

(86) PCT No.: PCT/EP2016/062914
§ 371 (c)(1),
(2) Date: Dec. 6, 2017

(87) PCT Pub. No.: WO2016/198409
PCT Pub. Date: Dec. 15, 2016

(65) Prior Publication Data
US 2018/0191532 A1    Jul. 5, 2018

(30) Foreign Application Priority Data

Jun. 12, 2015 (EP) .................................. 15305907

(51) Int. Cl.
*H04L 25/03* (2006.01)
*H03M 13/39* (2006.01)

(52) U.S. Cl.
CPC .. *H04L 25/03203* (2013.01); *H03M 13/3977* (2013.01); *H04L 25/0321* (2013.01); *H04L 25/03197* (2013.01); *H04L 25/03242* (2013.01)

(58) Field of Classification Search
CPC ............ H04L 1/0054; H04L 25/03242; H04L 25/03197; H04L 25/0321; H04L 25/03203;
(Continued)

(56) References Cited

U.S. PATENT DOCUMENTS

| 2005/0018793 | A1* | 1/2005 | Learned ................ H04L 1/0048 375/340 |
| 2010/0157785 | A1* | 6/2010 | Song ................ H04L 25/03203 370/203 |
| 2012/0263261 | A1 | 10/2012 | Gestner et al. |

FOREIGN PATENT DOCUMENTS

EP        3001625 A1    3/2016

OTHER PUBLICATIONS

Ouertani et al, "A Stack Algorithm with limited tree-search." IEEE, published 2009.*
(Continued)

*Primary Examiner* — Rahel Guarino
(74) *Attorney, Agent, or Firm* — Meagher Emanuel Laks Goldberg & Liao, LLP

(57) ABSTRACT

There is provided a decoder for decoding a data signal received through a transmission channel in a communication system, the decoder (310) comprising a symbol estimation unit (311) configured to determine estimated symbols representative of the transmitted symbols carried by the received signal, the estimated symbols being determined from nodes of a decoding tree based on a weight metric associated with each of the node. The decoder further comprises a termination alarm monitoring unit (312) for monitoring a termination alarm depending on the current decoding computation complexity, the termination alarm being associated with a metric parameter, the symbol estimation unit being configured to reduce the weight metric of each node of the decoding tree by a quantity corresponding
(Continued)

to a function of the metric parameter associated with the termination alarm, in response to the triggering of the termination alarm.

20 Claims, 8 Drawing Sheets

(58) Field of Classification Search
CPC ......... H04L 25/03292; H04L 25/03191; H04L 25/03184; H04L 2025/03611; H04L 25/03216; H03M 13/3746; H03M 13/451; H03M 13/2948; H03M 13/3977; H03M 13/6505
See application file for complete search history.

(56) References Cited

OTHER PUBLICATIONS

International Search Report and Written Opinion for PCT/EP2016/062914 dated Sep. 15, 2016.
Rym Ouertani et al: "A Stack algorithm with limited tree-search", Signals, Circuits and Systems (SCS), 2009 3rd International Conference on, IEEE, Piscataway, NJ, USA, Nov. 6, 2009 (Nov. 6, 2009), pp. 1-6.
Park C S et al: "Probabilistic Spherical Detection and VLSI Implementation for Multiple-Antenna Systems", IEEE Transactions on Circuits and Systems I: Regular Papers, IEEE, US, vol. 56, No. 3, Mar. 1, 2009 (Mar. 1, 2009), pp. 685-698.
Burg A et al: "Advanced Receiver Algorithms for MIMO Wireless Communications", Design, Automation and Test in Europe, 2006. Date '06. Proceedings Munich, Germany Mar. 6-10, 2006, Piscataway, NJ, USA,IEEE, vol. 1, Mar. 6, 2006 (Mar. 6, 2006), pp. 1-6.
E. Viterbo and J. Boutros: "A universal lattice code decoder for fading channels", IEEE Transactions on Information Theory, vol. 45 No. 5, pp. 1639-1642, Jul. 1999.
C. P. Schnorr and M. Euchner: "Lattice basis reduction: Improved practical algorithms and solving subset sum problems", in Math. Programming, pp. 181-191, 1993.
G. Caire K.R. Kumar and A.L. Moustakas: "Asymptotic performance of linear receivers in mimo fading channels", IEEE Transactions on Information Theory, vol. 55, No. 10, pp. 4398-4418, Oct. 2009.
A.R. Murugan, H. El-Gamal, M.-O. Damen, and G. Caire. A unified framework for tree search decoding: Rediscovering the sequential decoder. IEEE Transactions on Information Theory, vol. 52, No. 3, pp. 933-953, Mar. 2006.
F. Jelinek: "Fast sequential decoding algorithm using a stack", IBM, J. Res. Dev., vol. 13, No. 6, pp. 675-685, Nov. 1969.
R. Fano: "A heuristic discussion of probabilistic decoding", IEEE Transactions on Information Theory, vol. 9, No. 2, pp. 64-74, Apr. 1963.
G.R. Ben-Othman, et al.,: "The Spherical Bound Stack Decoder", in Proceedings of International Conference on Wireless and Mobile Computing, pp. 322-327, Oct. 2008.
J. C. Belfiore, et al: "The Golden Code: A 2×2 Full-Rate Space-Time Code with Non-Vanishing Determinants", IEEE Transactions on Information Theory, vol. 51, No. 4, pp. 1432-1436, Apr. 2005.

* cited by examiner

ANTICIPATED TERMINATION FOR SEQUENTIAL DECODERS

BACKGROUND

The invention generally relates to digital communication and in particular to methods, systems, and computer program products for sequential decoding of a received data signal.

Driven by the developments of digital technologies and the emergence of new multimedia applications, different wireless communication systems are available today. The most popular examples are the cellular and wireless ad-hoc networks accommodating single or multiple transmitters/receivers using single or multiple antennas, such as MIMO (Multiple-Input Multiple-Output) systems.

In addition to low-power consumption and memory requirements imposed by the system devices, a major challenge of such communication systems is the complexity cost. In order to warrant the deployment for real-time and high-throughput applications, it is desirable that the coding operations and decoding algorithms satisfy the authorized computational complexity which is prescribed for a given device and application.

Decoding methods such as "Maximum Likelihood" decoding (also called "ML" decoding) are known to decode a digital stream. Such decoding methods provide an estimation of the closest vector to the observed received signal under the minimization of a Euclidean distance criterion.

Such ML decoding techniques use an exhaustive search and provide optimal performance. However, they require a high complexity that increases as the size of the constellation codebook or the number of the transmit antennas becomes higher, thereby making the implementation of such techniques impossible in practical systems.

Other decoding techniques have been proposed to properly decode the received signal while considering the decoder complexity, such as the Sphere Decoder (E. Viterbo and J. Boutros. A universal lattice code decoder for fading channels. IEEE Transactions on Information Theory, 45(5): 1639{1642, July 1999) or the Schnorr-Euchner decoder (C. P. Schnorr and M. Euchner. Lattice basis reduction: Improved practical algorithms and solving subset sum problems. In Math. Programming, pages 181{191, 1993). A main drawback of these decoders is their increasing complexity when the constellation size or the number of antennas increases. Alternatively, suboptimal low-complexity decoders such as the ZF, the ZF-DFE and the MMSE (G. Caire K. R. Kumar and A. L. Moustakas. Asymptotic performance of linear receivers in mimo fading channels. IEEE Transactions on Information Theory, 55(10):4398{4418, October 2009) are implemented in practical systems presenting limited computational capabilities.

Still other ML decoding algorithms have been proposed to improve the computational complexity. In particular, lattice sequential decoders implementing a search over a decoding tree are of significant interest. This class of decoders includes Best-First tree search algorithms such as the Stack decoder as disclosed in:

A. R. Murugan, H. El-Gamal, M.-O. Damen, and G. Caire. A unified framework for tree search decoding: Rediscovering the sequential decoder. *IEEE Transactions on Information Theory*, 52(3):933-953, March 2006;

F. Jelinek. Fast sequential decoding algorithm using a stack. *IBM J. Res. Dev.*, 13(6):675-685, November 1969.

Another type of sequential decoding method using a Best-First tree search is known as the Fano decoding method as disclosed in R. Fano. A heuristic discussion of probabilistic decoding. *IEEE Transactions on Information Theory*, 9(2):64-74, April 1963.

Sequential decoding techniques (also known as "stack" decoding techniques) are based on a tree representation of the ML optimization problem (decoding tree) and on a tree search. In such decoding tree, each path from the root node to a leaf node is a possible transmitted signal. Nodes in the search tree correspond to different values taken by the decoded symbols and each path from the root node to a leaf node is a possible transmitted signal. Stack decoders improve the overall decoding complexity. However, for an increasing constellation size and a high number of antennas, the stack decoding technique requires a high computational complexity. In order to reduce this complexity, another decoding technique referred to as the Spherical-Bound Stack decoder (SB-Stack) has been proposed in the article by G. R. Ben-Othman, R. Ouertani, and A. Salah, entitled "The Spherical Bound Stack Decoder", In Proceedings of International Conference on Wireless and Mobile Computing, pages 322-327, October 2008. The SB-stack approach combines the Stack search strategy with the Sphere Decoder search region: the decoder searches for the closest vector inside a sphere centered at the received point implementing the stack decoding strategy. The spherical search region imposes a search interval for each detected symbol. Only nodes belonging to these intervals at each tree level are visited and expanded. Limiting the search space to a spherical region under the SB-Stack decoder provides a complexity gain of at least 30% over the Sphere Decoder. However, although the SB-stack decoder offers lower complexity than the Sphere Decoder, its implementation in practical systems requires high storage capacities.

Yet, in cases where the communication channel comprises deep fading, a longer decoding process may be required to provide optimal detection (also referred to hereinafter as decoding). This involves a need for a higher computational complexity that may not be available due to the limited hardware resources (arithmetic logic units, silicon area on integrated circuits, etc.). In such situations, optimal detection needs to be sacrificed for the sake of guaranteeing throughput using the available limited resources. As a result, the decoding method has to be finished prematurely and an emergent solution should be returned, according to early termination process.

According to a clipping approach, the decoding method is terminated by stopping it when a termination alarm is triggered and returning the actual visited points inside the sphere as an output. However, such solution is only applicable to Sphere Decoders or Schnorr-Euchner (SE) decoders and cannot enable termination of sequential decoders based on a Best-First tree search strategy. Particularly, such a solution does not allow to anticipate the termination so that the termination is triggered too late after the detection of termination conditions.

According to another approach provided for decoding methods implementing a Best-First tree search such as the Stack decoder, the early termination is achieved using a ZF-DFE termination technique as proposed in A. Salah, Low complexity decoding schemes for mimo systems, In PhD dissertation, 2010 (ZF-DFE stands for Zero-Forcing Decision Feedback Equalization). Accordingly, when the configured termination constraint is reached, the algorithm returns the ZF-DFE termination by visiting, at each tree level, only the best child of the current node in the top of the stack until a leaf node is reached. Although this termination technique is proved to outperform the clipping strategy, it provides suboptimal performance.

Accordingly, in most existing early decoding termination approaches, the receiver terminates when the termination constraints are reached. The decoding algorithm in such cases starts operating in a normal way and when the termination alarm is triggered, the decoder returns an emergent solution which can be suboptimal. Thus, improved sequential decoding systems, methods, and computer program products are needed that enable anticipated termination of the decoding algorithm while preserving optimal performances.

SUMMARY

In order to address these and other problems, there is provided a decoder for decoding a data signal received through a transmission channel in a communication system, the decoder comprising a symbol estimation unit configured to determine estimated symbols representative of the transmitted symbols carried by the received signal, the estimated symbols being determined from nodes of a decoding tree based on a weight metric associated with each of the node. The decoder further comprises a termination alarm monitoring unit for monitoring a termination alarm depending on the current decoding computation complexity, the termination alarm being associated with a metric parameter, the symbol estimation unit being configured to reduce the weight metric of each node of the decoding tree by a quantity corresponding to a function of the metric parameter associated with the termination alarm, in response to the triggering of the termination alarm.

In one embodiment, the termination alarm monitoring unit may be configured for monitoring a set of termination alarms depending on the current decoding computation complexity, each termination alarm being associated with a metric parameter. In response to the triggering of at least one termination alarm, the symbol estimation unit is configured to reduce the weight metric of each node of the decoding tree by a quantity corresponding to a function of the metric parameter associated with the triggered termination alarm.

The weight metric associated with a node may be a function of the Euclidean distance between the signal received and the path between the root node of the decoding tree and the node.

Each termination alarm may depend on a triggering condition related to a computational complexity indicator representing the current decoding computation complexity, the triggering condition associated with a given termination alarm comprising the comparison of the computational complexity indicator with a portion of a predefined complexity threshold.

The complexity indicator C may represent the number of multiplicative operations.

Each triggering condition may comprise determining if the computational complexity indicator reaches the portion of the predefined decoding computational complexity threshold.

In certain embodiments, each node of the decoding tree may correspond to a given level of the decoding tree and the quantity associated with a given termination alarm is a linear function of the metric parameter, the slope parameter of the linear function corresponding to the level of the tree of the node.

In one embodiment, the metric parameters of the termination alarms may be non-zero positive value parameters.

Particularly, the metric parameter of the first monitored termination alarm may be defined from the noise level.

Further, the metric parameter of each termination alarm may be determined from the value of the metric parameter of the previously triggered alarm.

Alternatively, the metric parameter of the termination alarm may be determined as a linear function of the metric parameter of the previously triggered alarm.

In still another embodiment, for at least some of the termination alarms, the metric parameter associated with a given termination alarm may be determined to be superior or equal to the value of the metric parameter of the previously triggered alarm.

In yet another embodiment, for at least some of the termination alarms, the metric parameter of the termination alarm may be determined as a linear function of the metric parameter of the first triggered alarm.

The total number of termination alarms may be a function of a predefined complexity threshold ($C_{th}$).

In one application of the invention, the decoding method may be a stack decoding method comprising the steps of iteratively constructing the decoding tree, the step of constructing the decoding tree implementing at least one iteration of the following steps, for a current node of the tree stored in the top of a stack:

generating a set of child nodes of the current node from the vector representing the received data signal, and for each child node determining the weight metric, removing the current node from the stack;

storing in the stack selected nodes among the set generated child nodes, each child node being stored in the stack in association with node information comprising the weight metric, the nodes in the stack being ordered by increasing values of metrics;

selecting the top node of the stack as the new current node;

the estimation of symbols representative of the transmitted symbols carried by the received signal being determined from the node information stored in the stack.

There is also provided a receiver for receiving and decoding an encoded data signal, the receiver comprises a decoder according to any of the previous embodiments for decoding the data signal.

The invention further provides a wireless (fixed or mobile) device capable of transmitting and receiving data in a wireless communication network, wherein the wireless device comprises the previous receiver for receiving a data signal.

The invention also provides a method of decoding a data signal received through a transmission channel in a communication system, the method comprising determining estimated symbols representative of the transmitted symbols carried by the received signal, the estimated symbols being determined from nodes of a decoding tree based on a weight metric associated with each of the node. The method further comprises monitoring a termination alarm depending on the current decoding computation complexity, the termination alarm being associated with a metric parameter, the step of determining estimated symbols comprising, in response to the triggering of the termination alarm, reducing the weight metric of each node of the decoding tree by a quantity corresponding to a function of the metric parameter associated with the termination alarm.

The method may further comprise monitoring a set of termination alarms depending on the current decoding computation complexity, each termination alarm being associated with a metric parameter and, in response to the triggering of at least one termination alarm, the step of determining estimated symbols comprises reducing the weight metric of each node of the decoding tree by a quantity corresponding to a function of the metric parameter associated with the triggered termination alarm.

There is also provided a computer program product for decoding a data signal received through a transmission channel in a communication system by determining estimated symbols representative of the transmitted symbols carried by the received signal, the computer program product comprising:

a non-transitory computer readable storage medium; and instructions stored on the non-transitory computer readable storage medium that, when executed by a processor, cause the processor to monitor a termination alarm depending on the current decoding computation complexity, the termination alarm being associated with a metric parameter, the processor being further caused to determine estimated symbols by reducing the weight metric of each node of the decoding tree by a quantity corresponding to a function of the metric parameter associated with the triggered termination alarm, in response to the triggering of the termination alarm.

The various embodiments of the invention allow the receiver to anticipate the end of the decoding process and prepare a solution to exit when termination is imposed.

Further advantages of the present invention will become clear to the skilled person upon examination of the drawings and detailed description. It is intended that any additional advantages be incorporated herein.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, serve to explain the embodiments of the invention.

DETAILED DESCRIPTION

Figure 1:
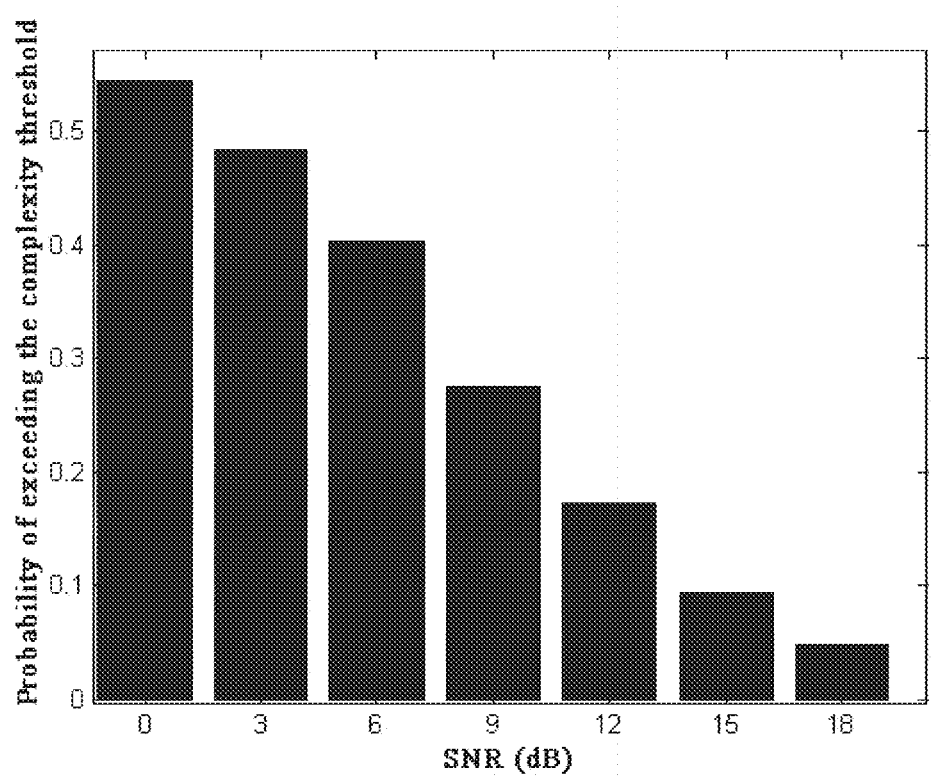
FIG. 1 is a diagram representing the probability of having a decoding complexity higher than a fixed threshold as a function of the Signal-to-Noise Ratio (SNR)

Embodiments of the invention provide methods and apparatuses for sequential decoding of a data signal received over a communication channel that enable anticipated termination of the decoding algorithm by imposing a set of termination alarms, the triggering of one of the termination alarms resulting in a modified computation of information used by the decoding method.

The present invention may be implemented in a wireless communication system for detecting lattice points. The communication system comprises at least a transmitter for transmitting simultaneously a plurality of lattice points through a communication channel, and at least a receiver for receiving one or more of the lattice points transmitted by the transmitter in the form of independent signals.

An embodiment of the invention may be integrated in a receiver, for example for the decoding of data transmitted in a MIMO (Multiple Input Multiple Output) channel or for the detection of multiple users.

The decoding method may decode a data signal received through the transmission channel in a communication system, by determining estimated symbols representative of the transmitted symbols carried by the received signal, based on the construction of a decoding tree comprising a plurality of nodes representing possible components of a symbol of the received data signal and the determination of node information for selected nodes of the tree. The estimated symbols may be determined from nodes of a decoding tree depending on node information including a weight metric associated with each node. The weight metric associated with a node represents a function of the Euclidean distance between the signal received and the path between the root node of the decoding tree and the node.

Specifically, a decoder using a conventional sequential algorithm may determine the most likely path in the tree. At the receiving side, the receiver observes a sequence of the encoded bits (sequence of symbols). The decoder proceeds to reconstruct paths through the tree in response to a received signal by calculating a metric (also referred to as a weight metric, a weight or cost) between the received signal (received sequence) and paths through the tree. The metric of a node may be determined from the Euclidean distance between the signals received and the path between the root node and the node considered. The decoded sequence corresponds to the code word sequence having the smallest metric.

In particular, a sequential decoder using a Best-First tree search strategy (stack decoder) only explores paths of the decoding tree having smallest weights than a predefined weight constraint, according to the following conventional method:

1—Starting from the root node, the algorithm generates all child nodes $s_n$ (also called descendent nodes) and calculates their respective metrics.

2—A set of these child nodes are then inserted in a stack (or list) together with their metrics.

3—The nodes in the stack are then sorted by decreasing order of their metrics.

4—It is determined if the node newly positioned at the top of the stack is a leaf node. If the top node is not a leaf node, the operations of steps 1 to 3 are repeated for the top node instead of the root node, recursively.

5—Otherwise if the root node is a leaf node, the process is terminated and a path leading from the root node to the node at the top of the stack is outputted.

In a hard-decision approach, only one iteration of steps 1 to 5 may be performed. Alternatively, a number of iterations of steps 1 to 5 may be performed (soft-decision approach) so as to make a probabilistic estimation of the received signal. The data signal can be estimated by taking into account the node information stored in the stack, and in particular the path(s) obtained from the stack.

In conventional termination approaches, the receiver terminates the decoding method when the termination constraints are reached. The conventional decoding method starts operating in a normal way as described above and when a termination alarm is triggered, the decoder returns an emergent solution, which can be suboptimal.

It should be noted that the problem of early termination particularly arises in communication links in presence of poor channel realizations for which obtaining optimal performance requires a high computational complexity that may exceed the prescribed complexity.

FIG. 1 is a diagram illustrating the probability of having a decoding complexity higher than a fixed threshold as a function of the SNR (Signal to Noise Ratio) in a 2×2 MIMO communication system ($n_t=n_r=2$) comprising a Sequential Decoder using spatial multiplexing and 16-QAM modulations, with a complexity threshold of $C_{th}=180$ multiplicative operations per decoded symbols vector (for all SNR values).

As shown in FIG. 1, the probability that the decoding complexity may exceed the prescribed complexity (complexity threshold) is significant. For all the concerned channel realizations requiring higher complexity than the complexity threshold, the use of conventional termination techniques that operate until the termination alarm is activated impacts the performance and results in returning a suboptimal estimation of the desired information symbols.

The various embodiments of the invention provide an anticipated termination of the decoding method which avoids such emergency termination which is triggered only when the emergency situation has been reached.

The proposed improved termination anticipates the end of the decoding method by setting a plurality of alarms, the triggering of one termination alarm providing a respective parameter which is used to modify the computation of node information for the node selected in the decoding tree, and in particular the weight metric of a node. Instead of waiting for a termination alarm to be activated once an emergency situation has been detected, the termination method according to the various embodiments of the invention anticipates the ending of the sequential decoding method and progressively prepares the solution to be returned any time the sequential method is to be terminated.

According to certain embodiments of the invention, a set of termination alarms $A_p$ may be monitored, each alarm being related to a complexity indicator C representing the current decoding computational complexity. In response to the triggering of a given termination alarm, the decoder may modify the computation of the weight metric associated with a node of the tree being processed (which represents a function of the Euclidean distance between the signal received and the path between the root node of the decoding tree and the node) by further taking into account a function $g^i(q_p)$ of the metric parameter $q_p$ associated with the last triggered termination alarm $A_p$. In particular, the decoder may determine the weight metric of the node by reducing the Euclidean distance of a quantity represented by the function $g^i(q_p)$ of the metric parameter $q_p$ associated with the last triggered termination alarm $A_p$.

By monitoring the set of termination alarms, the end of the decoding process may be anticipated. Accordingly, instead of waiting for the termination alarm to be activated, the ending of the decoding process is progressively prepared while ensuring that the solution is returned. The decoding method and the convergence time may be thus accelerated, which results in a reduction of the overall decoding complexity.

Each alarm $A_p$ may be triggered depending on a condition related to a decoding complexity indicator C (referred to simply hereinafter as the "complexity indicator") representing the current computational complexity. In certain embodiments, the decoding complexity indicator C may represent the number of multiplicative operations (or computational complexity) in all the previous decoding steps. The triggering condition associated with each termination alarm comprises the comparison of the decoding complexity indicator with a complexity threshold $C_{th}$, which may represent the prescribed computational complexity.

The metric parameter $q_p$ may be computed for each triggered termination alarm $A_p$, the parameter $q_p$ being used to modify the computation of the metrics associated with the child node. Each metric parameter $q_p$ may be a positive real number ($q_p \in \mathbb{R}^+$) associated with one termination alarm $A_p$ (p comprised between 1 and N where N is the total number of termination alarms that may be triggered). Also, each metric parameter $q_p$ may be defined so that the metric parameter $q_p$ for the currently monitored termination alarm is higher than the metric parameter $q_{p-1}$ associated with the previously triggered termination alarm $A_{p-1}$ (with $q_p > q_{p-1}$).

The total number N of termination alarms $A_p$ which are monitored may be a function of the threshold decoding complexity $C_{th}$, which may depend on the target application as well as on the hardware resources.

The present invention may be implemented in a wireless communication system for detecting information symbols (also referred to hereinafter as lattice points). The communication system comprises at least a transmitter for transmitting simultaneously a plurality of information symbols through a communication channel, and at least a receiver for receiving one or more of the symbols transmitted by the transmitter(s) in the form of independent signals. The communication channel may be any linear AWGN (Additive White Gaussian Noise) channel or a multipath channel. The communication system may use any multiple access technique such as Time Division Multiple Access, Frequency Division Multiple Access, Code Division Multiple Access, and Space Division Multiple Access. In addition, the communication system may use single-carrier or multi-carrier modulation formats such as OFDM (Orthogonal Frequency-Division Multiplexing) or FBMC (Filter Bank Multi-Carrier).

In another application to optical fiber-based communication systems, encoded data according to the various embodiments may correspond to the information symbols transmitted through the different polarization states of the optical fiber or propagating over the different modes of multi-mode fibers. In addition, a multiple access technique such as WDMA (Wavelength Division Multiple Access) may be used in such optical communication systems.

An embodiment of the invention can be integrated in a receiver, for example for the decoding of data transmitted in a MIMO (Multiple Input Multiple Output) channel, according to any MIMO configuration, or for the detection of multiple users.

When applied to MIMO decoding, for a single user or multiple users detection, the dimension of the received signal or channel output depends on the dimension of the signal space at the transmitter, on the number ($n_t$) of the Transmit (Tx) antennas and/or on the number ($n_r$) of Receive (Rx) antennas.

The wireless network environment may comprise a plurality of base stations (also referred to as "nodes" or "access points" or "cells" depending on the application context of the invention), each base station including a transmitter and a receiver including one or more antennas. Each station may communicate with other stations through a wireless connection.

Figure 2:
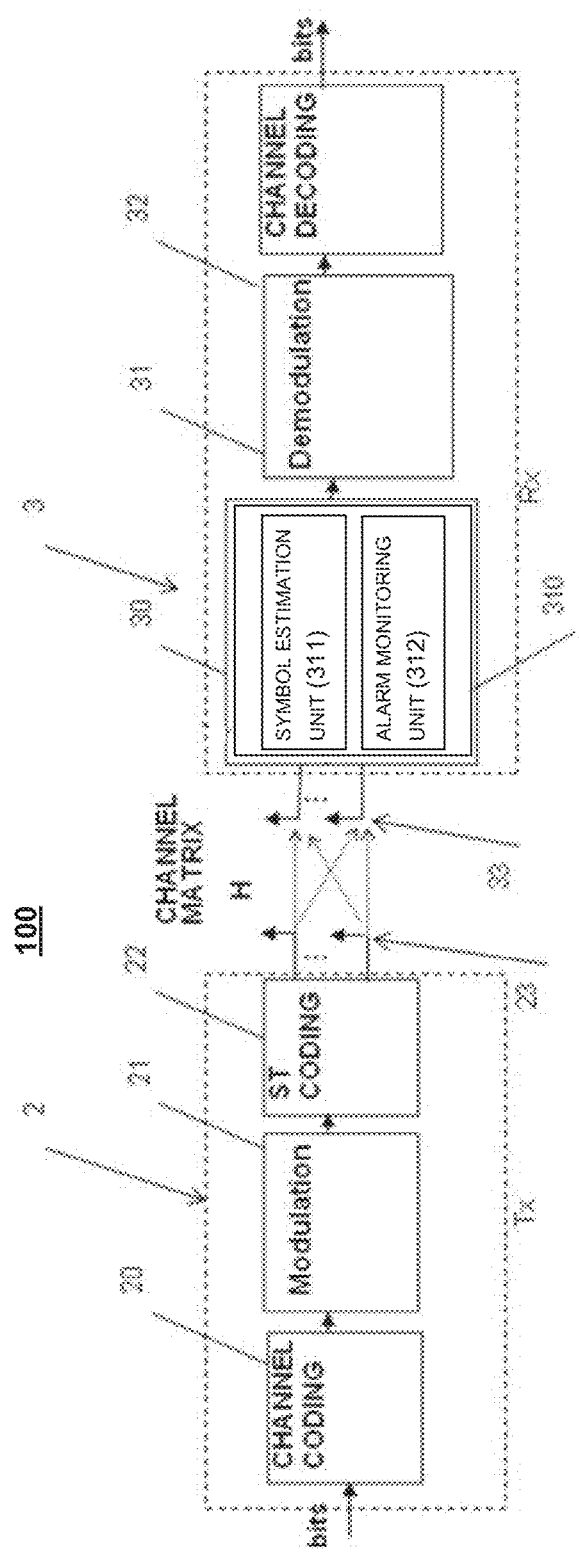
FIG. 2 schematically represents an exemplary communication system implementing the decoding method.

Referring to FIG. 2, an exemplary wireless communication system 100 between a transmitter and a receiver in which a MIMO transmission is used to distribute the symbols modulated over various degrees of freedom of the channel. Each transmitter 2 of a station may exchange data with a receiver 3 of another station according to the wireless communication system. The wireless network 100 may rely on a centralized architecture (a controller is provided to control the operation of the base stations) or a decentralized architecture (the base stations may communicate directly with one another). User Terminals (such as wireless devices, cellular phones, personal digital assistants, etc.), may communicate with one or more base stations on the forward link or on the reverse links. The user terminals may be fixed or mobile.

The MIMO configuration may be symmetric, in which case it includes a same number ($n_t$) of Transmit antennas as the number ($n_r$) of Receive antennas. Alternatively, the MIMO configuration may be asymmetric, in which case the number ($n_t$) of Transmit antennas is different from the number ($n_r$) of Receive antennas (in particular the number $n_r$, at the receive side, is higher than $n_t$, at the transmit side to avoid a rank deficiency).

The transmitter 2 can transmit a signal to a receiver 3 by means of a noisy MIMO channel. The data transmitter 2 can in particular be integrated in the base stations. The transmitter 2 may comprise for example:

a channel coder 20 for providing convolutional codes,
a modulator 21 such as a QAM modulator for delivering symbols;
a space/time coder 22 for delivering a code word;
$n_t$ transmission antennas 23, each transmission antenna being associated with an OFDM modulator.

The transmitter 2 codes a binary signal received as input using a convolutional code provided by the channel coder 20. The signal is then modulated by the modulator 21 according to a modulation scheme (for example, a quadrature amplitude modulation nQAM). The modulator 21 can also implement a modulation scheme generating complex symbols, each complex symbol belonging to a group of symbols $s_i$. The modulated symbols thus obtained are then coded by the space-time coder 22 to form a code word STBC, such as the Golden Code ("The Golden Code: A 2×2 Full-Rate Space-Time Code with Non-Vanishing Determinants", J.-C. Belfiore, G. Rekaya, E. Viterbo, IEEE Transactions on Information Theory, vol. 51, no. 4, pages 1432-1436, April 2005). The STBC code may be based on a complex matrix of dimension $n_t \times T$, in which $n_t$ designates the number of transmission antennas and T is the time length of the STBC code, or on a spatial multiplexing (the modulated symbols are directly sent to the transmission antennas).

The code word thus generated is converted from the time domain to the frequency domain and distributed over the $n_t$ transmission antennas. Each dedicated signal is then modulated by a respective OFDM modulator, and transmitted over the corresponding transmission antenna 23, optionally after filtering, frequency transposition and amplification.

The receiver 3 can be also integrated in the base stations. The receiver 3 may be configured to receive a signal y transmitted by the transmitter 2 in a wireless channel. The channel may be noisy (for example channel with Additive White Gaussian Noise (AWGN) subjected to fading). The signal transmitted by the transmitter 2 may be further affected by echoes due to the multiple paths and/or the Doppler effect due to the transmitter and receiver having a non-zero relative velocity.

In one exemplary embodiment, the receiver 3 may comprise:

$n_r$ receiving antennas 33 for receiving the signal y, each receiving antenna being associated with a respective OFDM demodulator; the OFDM demodulators ($n_r$ demodulators) are configured to demodulate the received signal observed at each receiving antenna and delivering demodulated signals. A frequency/time converter may be used to perform a reverse operation of the time/frequency conversion implemented in transmission, and to deliver a signal in the frequency domain;

a space/time decoder 30 configured to deliver a decoded signal;

a demodulator 31 configured to perform a demodulation associated with a decoding.

The Space Time decoder 30 comprises a sequential decoder 310 according to the embodiments of the invention which is configured to decode the received signal. In particular, the decoder may comprise a symbol estimation unit 311 configured to determine estimated symbols representative of the transmitted symbols carried by the received signal, the estimated symbols being determined from nodes of a decoding tree based on a weight metric associated with each node. The decoder 30 may further comprise a termination alarm monitoring unit 312 for monitoring a set of termination alarms depending on the current decoding computation complexity. Each termination alarm is associated with a respective metric parameter. The symbol estimation unit 311 is configured to reduce the weight metric of each node of the decoding tree of a quantity corresponding to a function of said metric parameter associated with the triggered termination alarm, in response to the triggering of at least one termination alarm.

It should be noted that the receiver 3 implements a reverse processing of the processing implemented in transmission. Accordingly, if a single-carrier modulation is implemented in transmission instead of a multi-carrier modulation, the $n_r$ OFDM demodulators are replaced by corresponding single-carrier demodulators.

The skilled person will readily understand that the various embodiments of the invention are not limited to specific applications. Exemplary applications of this new decoder include, with no limitation, multi-user communication systems, MIMO decoding in configurations implementable in wireless standards such as the WiFi (IEEE 802.11n), the cellular WiMax (IEEE 802.16e), the cooperative WiMax (IEEE 802.16j), the Long Term Evolution (LTE), the LTE-advanced, the 5G ongoing standardization, and optical communications.

In one application of the invention to a multi-antenna system to decode a signal received by the multi-antenna system (MIMO), with $n_t$ transmit and $n_r$ receive antennas using spatial multiplexing, the data signal y, received as a complex-valued vector is equal to:

$$y\_c = H\_c \, s\_c + w\_c \qquad (1)$$

In Equation (1), $H_c$, $s_c$ and $w_c$ designate respectively the complex value of the channel matrix H, the vector s representing the transmitted data signal and the noise vector w.

The received signal $y_c$ may be then transformed into a real-valued representation, for example according to equation (2):

$$y = \begin{bmatrix} \mathcal{R}(H_c) & -\mathcal{J}(H_c) \\ \mathcal{J}(H_c) & \mathcal{R}(H_c) \end{bmatrix} \begin{bmatrix} \mathcal{R}(s_c) \\ \mathcal{J}(s_c) \end{bmatrix} + \begin{bmatrix} \mathcal{R}(w_c) \\ \mathcal{J}(w_c) \end{bmatrix} \quad (2)$$

In equation (2), $\mathcal{R}(.)$ and $\mathcal{J}(.)$ denote respectively the real and imaginary parts of a complex-valued vector.

The equivalent channel output can then be written as:

$$y = Hs + w \quad (3)$$

In embodiments where a length-T Space-Time code is used, the channel output can be written in the same form of equation (1) with the equivalent channel matrix $H_{eq}$ given by:

$$H_{eq} = H_c \Phi \quad (4)$$

In equation (4), $\Phi \in \mathbb{C}^{n_t T \times n_t T}$ corresponds to the coding matrix of the underlying code. For ease of presentation and given that both uncoded and coded schemes result in a same real-valued lattice representation, the following description will be made with reference to the spatial multiplexing and symmetric case with $n_t = n_r$ and $n = 2n_t$.

According to the equivalent system obtained in (3), the received signal can be viewed as a point of the lattice generated by H and perturbed by the noise vector w.

When perfect detection is required, the receiver implements an ML decoder that attempts to determine, given the channel output and the channel matrix, an estimate $\hat{s}$ of the originally transmitted symbols vector from the given data in H and y, according to the minimization of the error probability such that:

$$\hat{s} = \text{argmin}_{s_c \in \mathcal{A}} P_r(\hat{s} \neq s) \quad (5)$$

In Equation 5, the finite subset $\mathcal{A}$ represents the modulation alphabet to which belong the information symbols. The minimization of the error probability under ML detection is equivalent to the minimization problem given by:

$$\hat{s} = \text{argmin}_{s_c \in \mathcal{A}} \|y - Hs\|^2 \quad (6)$$

Assuming coherent system where H is perfectly known at the receiver (for example estimated using estimation techniques such as least square estimators), optimal ML detection may be solved for the closest vector in the n-dimensional lattice generated by H according to the minimization problem of Equation 6.

Thus the ML detector chooses the symbols vector s which yields the smallest Euclidean distance between the received vector y, and hypothesized message Hs. The ML detector represents a discrete optimization problem over candidate vectors s within the chosen constellation. In the case of higher constellations and higher dimension of the system (number of antennas), the search for the ML solution in an exhaustive way generally requires a very high complexity.

Sequential decoders implementing a tree search strategy searches the closest lattice point to the received vector using a decoding tree structure. Before transmission of the signal to such a sequential decoder, a predecoding may be performed using a QR decomposition of the channel matrix such that H=QR where Q designates the orthogonal matrix and R designate the upper triangular matrix. Given the orthogonality of Q, equation (4) can be rewritten in the following form:

$$\tilde{y} = Q^t y = Rs + Q^t w \quad (7)$$

The ML decoding problem then amounts to solving the equivalent system given by:

$$\hat{s} = \text{argmin}_{s_c \in \mathcal{A}} \|\tilde{y} - Rs\|^2 \quad (8)$$

The triangular structure of R reduces the search of the closest point to a sequential tree-search. Nodes in the tree represent the different possible values of the symbols $s_i$. The symbols $s_i$ for i=1, . . . , n represent the real and imaginary components of the transmitted information vector $s_c$. A tree branch represents two consecutive nodes $(s_{i+1}, s_i)$.

As used herein, a "node" refers to an element of a decoding tree data structure representing constellation points of the received signal corresponding to a constellation such as a $2^q$ QAM. Specifically, a node comprises an integer value representing a component of a symbol of the received data signal (the received data signal may be represented according to a real-valued representation). In the following description, the term "node" or "node value" will be similarly used to designate a component of a symbol of the received data signal. The first node of the tree is referred to as the root node. A node that does not have any child node is referred to as a "leaf" node and corresponds to the lowest level in the tree. Each node has at most one parent node located above it in the tree. The root node being the highest node in the tree, it does not have any parent node. The dimension of a node corresponds to the number of levels between that node and the root node. The depth (or dimension) of a given node designates the length of the path from this given node up to the root node of the decoding tree. All the nodes of the decoding tree can be reached from the root node. Each path from the root node to a leaf node thus represents a possible transmitted signal.

Figure 3:
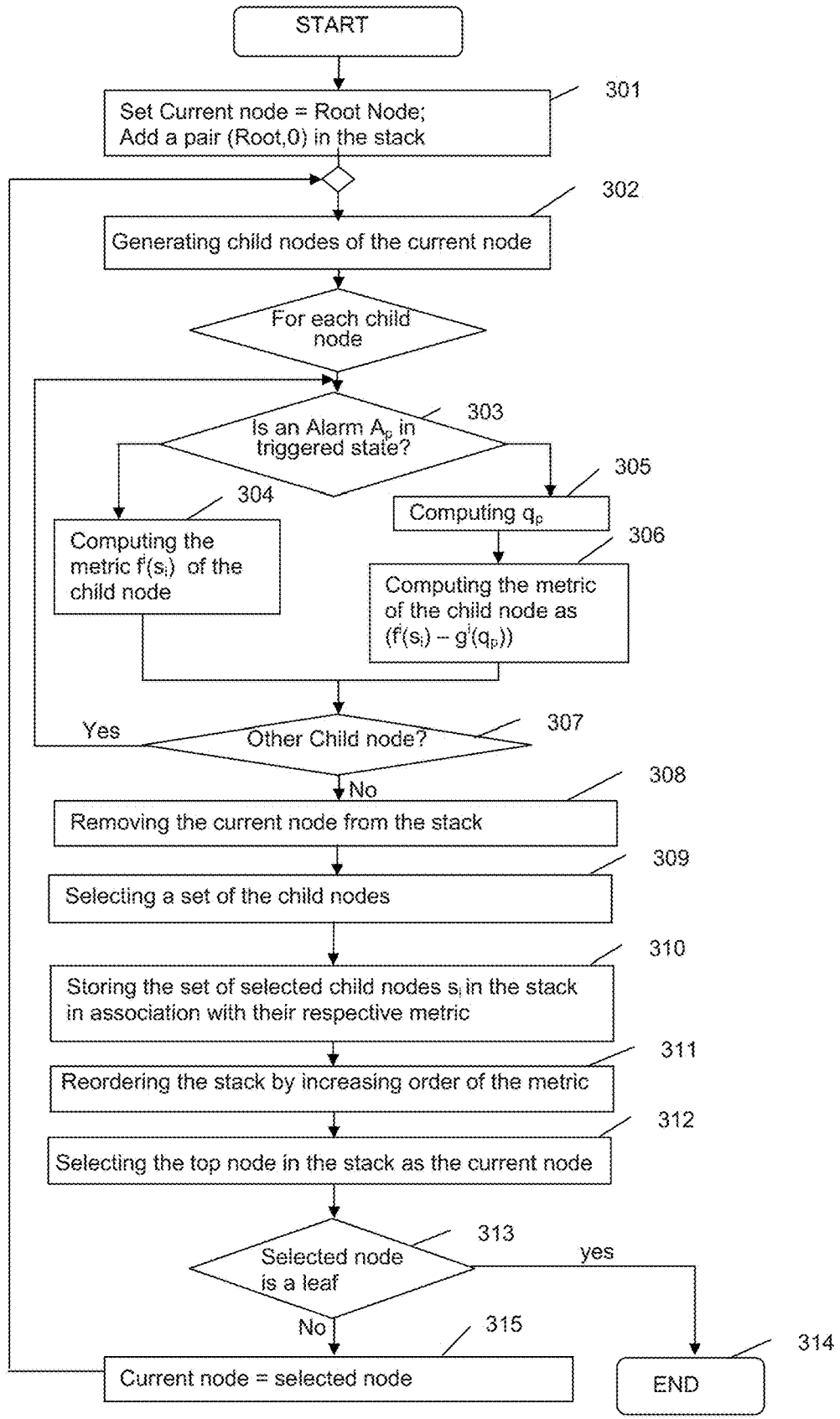
FIG. 3 is a flowchart depicting a sequential decoding method with anticipated termination according to certain embodiments.

Referring now to FIG. 3, a flowchart is presented that depicts a sequential decoding method which may be executed by the receiver 3 according to certain embodiments. A sequential decoding method uses a sequential decoding tree (also known as "search tree" or "logical tree") for decoding a received data signal, corresponding to a transmitted data signal transported by a transmission channel associated with a channel matrix H.

The search tree (also referred to as "the decoding tree" hereinafter) may be generated through a QR decomposition of the channel matrix H (H=QR) in a pre-decoding phase as described above, where $Q^t$ represents an orthogonal matrix and R represents the generator matrix in the decoding equivalent system, and through a multiplication of the received signal by $Q^t$. Given the upper triangular structure of the matrix R, the ML optimization problem is solved by performing a tree-search based on the generation of the decoding tree. An empty stack or list may be also initialized.

In step 301, the root node is selected as the current node and a pair (Root, 0) is added to the stack at the top position.

In step 302, the child nodes (or descendent nodes) of the root node representing all the possibilities of the first symbol $x_1$ are generated. Specifically, for the current node being processed, all or a selected set of child nodes may be determined by projecting on the i-th layer of the matrix R resulting from the QR decomposition.

Steps 303 to 306 are performed for each child node generated in step 302.

In step 303, it is determined if one termination alarm $A_p$ among the set of termination alarms related to the complexity indicator C is in a triggered state.

If no termination alarm $A_p$ has been triggered, in step 304, the metric of the child node is calculated from the Euclidean distance $f'(s_i)$ between the signals received and the path between the root node and the node considered.

Otherwise, if a termination alarm $A_p$ has been determined as being in a triggered state in step 303, the metric parameter $q_p$ associated with the alarm is determined in step 305 and in step 306, the metric of the child node is calculated from the difference $f'(s_i) - g^i(q_p)$ between:
- the Euclidean distance $f(s)$ between the signals received and the path between the root node and the node considered; and
- a function $g^i(q_p)$ of the metric parameter $q_p$.

In the decoding tree, there exists a single path between the root node and the child node being considered. From this path, it is thus possible to determine the corresponding decoded bits or an estimation of the transmitted information sequence transmitted between the root node and the child node considered.

Steps 303 to 306 are then iterated for each child node generated in step 302 (block 307).

When all the child nodes have been processed, in step 308, the node positioned at the top of the stack is removed from the stack. In the first iteration of steps 301 to 314, the top node is the root node.

In step 310, all the child nodes or a set of the child nodes (selected in step 309) are inserted in the stack. Each child node $s_i$ is added in the stack together with its respective metric determined from either $f'(s_i)$ or the difference $f'(s_i) - g^i(q_p)$ in step 304 or 306, depending on whether a complexity indicator termination alarm $A_p$ has been triggered. Additional data may be further inserted in the stack in association with each child nodes such as the path and/or the dimension of the child node.

In step 311, the nodes in the stack are arranged according to a decreasing order of the metrics associated with nodes.

In step 312, the top node of the stack $s_{top}$ is selected as the current node in order to generate its child nodes.

In step 313, it is determined if the selected node is a leaf node. If the selected node is a leaf node (i.e. having no child node), the method is terminated in step 314. The decoder may then return an estimate of the symbols vector.

Otherwise, in step 315, the selected node is set as the current node and steps 301 to 314 may be repeated for the newly selected node (which represents the node having the lowest metric in the stack) to generate the child nodes, at a next level j of the decoding tree with j being comprised between n−1 to 1. The next processed level j depends on the top node selected in the stack.

Each iteration of steps 301 to 314 (corresponding to the processing of a current node) thus provides a path between the root node and a new leaf node stored in the stack.

The received signal may be estimated from the node information stored in the stack, and in particular the path(s) stored in the stack when such information is available. For example, if a symbol estimation (hard decision) is applied, the construction of the tree implements a single iteration of steps 301 to 314 enabling a single path to be determined corresponding to a hard estimation of the transmitted data signal. Alternatively, if a probabilistic estimation (soft decision) may be applied, the decoding method may deliver soft-output information in the form of Log-Likelihood Ratio (LLR) values. In this case, several iterations of steps 302 to 315 may be performed. Each iteration provides a different path from the root node to leaf nodes (representing a candidate lattice vector). These different paths (representing candidate lattice vectors) may then be stored in an auxiliary stack together with their paths. A probabilistic estimation of the information signal can be determined based on these paths.

The set of termination alarms $A_p$ related to the decoding complexity are advantageously configured so that only one termination alarm may be set at a triggered state, at a time.

Depending on the predefined hardware requirements related to the prescribed decoding complexity (for example a threshold representing the prescribed decoding complexity or a fixed processing time corresponding to the prescribed decoding complexity), the termination alarms may only be triggered after the decoder starts in an optimal way (the weight metrics of the visited nodes in the tree being then initially computed from $f'(s_i)$ according to step 304 of FIG. 3). The decoder may then switch to a suboptimal operation once a termination alarm $A_p$ is triggered.

The algorithm continues the decoding process until the decoding complexity indicator reaches another percentage $\sigma_{p+1}$ of the decoding complexity threshold (representing the target decoding complexity), thereby triggering a next termination alarm $A_{p+1}$. The decoder introduces at this stage another metric parameter $q_{p+1} > q_p$ to be considered in the following decoding steps while computing the metrics of the tree nodes to be stored in the stack (step 305 of FIG. 3).

The decoding algorithm may terminate after using a single termination alarm or several termination alarms.

In certain embodiments, the decoder may check one predefined condition comprising the comparison of the complexity indicator C with a lower threshold $C_p = a_p C_{th}$, the satisfaction of this condition triggering a termination alarm $A_p$. The lower threshold $C_p$ thus depends on a complexity threshold $C_{th}$. In certain embodiments, the decoder may check the complexity related condition at a predefined frequency.

The alarm parameter is defined in response to the triggering of the previous termination alarm $A_{p-1}$ by increasing its value. Once a new termination alarm is triggered, the state of the previously triggered alarm is passed to a non triggered state.

The complexity threshold $C_{th}$ represents the prescribed complexity. The complexity threshold may represent a system parameter that may be defined given hardware specifications and target applications. The complexity threshold $C_{th}$ may be predefined from the average complexity or the complexity corresponding to "good" transmission channels.

In one exemplary embodiment, two termination alarms may be successively checked $A_1$ and $A_2$, the first termination alarm $A_1$ being associated with an alarm parameter $a_1$ and the second termination alarm being associated with an alarm parameter $a_2 > a_1$, with $a_1$ and $a_2$ inferior to 1.

Accordingly, the first termination alarm $A_1$ may triggered if the condition related to the complexity indicator C is satisfied:

$$C = a_1 C_{th}$$

Similarly, the second termination alarm $A_2$ may be triggered if the condition related to the complexity indicator C is satisfied, and the first termination alarm has been reset to a non triggered state:

$$C = a_2 C_{th}.$$

In particular the second alarm parameter $a_2$ may be chosen to be higher than the first second alarm parameter $a_1$.

Figure 4:
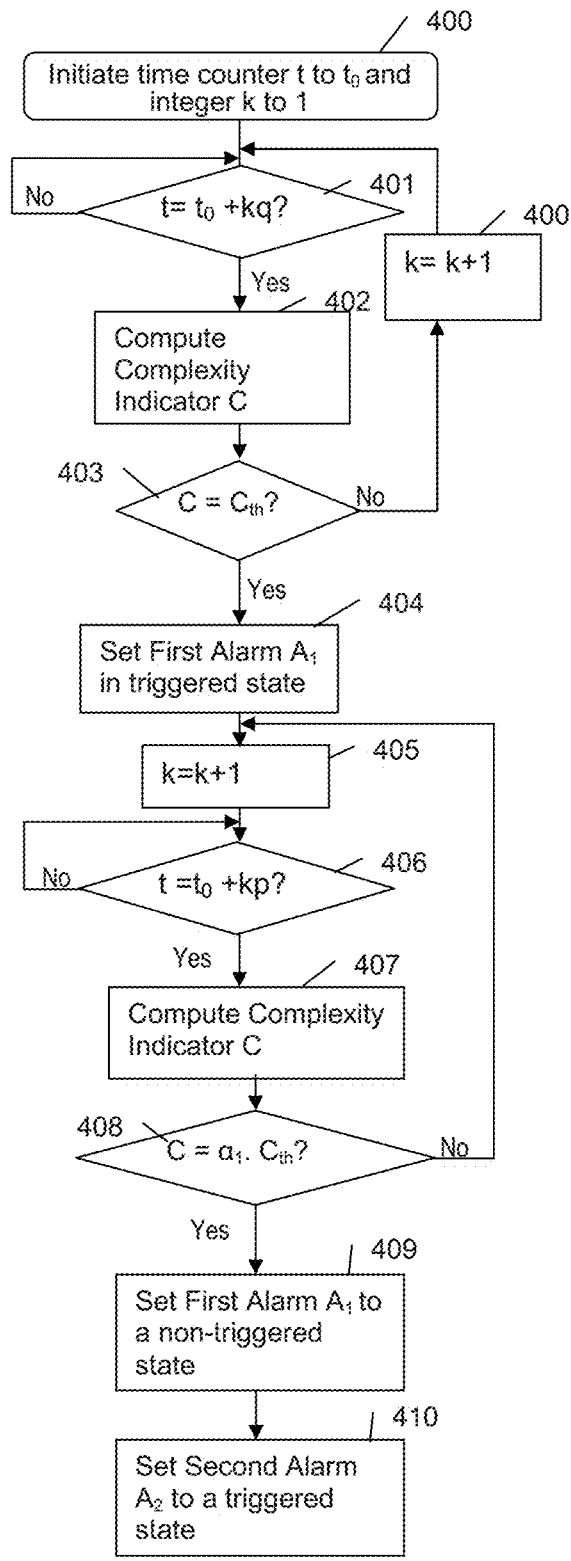
FIG. 4 is a flowchart depicting the anticipated termination method according to certain embodiments.

Referring to FIG. 4, a flowchart is presented that depicts the steps of monitoring the two termination alarms $A_1$ and $A_2$ which may be executed by the receiver 3, according to one embodiment.

In step 400, a time counter t is initialized to $t_0$ and an integer k is initialized to 1. The time counter t is used to periodically check a condition related to the complexity indicator, according to a predefined period q.

In step 401, it is detected that the period q has elapsed so that the first condition related to the complexity indicator C may be checked.

In step 402, the complexity indicator C may be computed by evaluating the number of multiplication operations performed by the decoding algorithm or the computation time.

In step 403, it is determined if the first condition $C=a_1 \cdot C_{th}$ is verified, with $a_1=1$, from the value of C computed in step 402 and the value of the complexity threshold $C_{th}$.

In step 404, the first Termination alarm $A_1$ is set to a triggered state. The metric of a child node will be thus computed taking into account the metric parameter $q_1$, in step 305 of FIG. 3. The decoder switches to suboptimal decoding by introducing the first metric parameter $q_1$ that is deduced from the metrics (also referred to as "weight metrics" hereinafter) of the child nodes in the stack during the following decoding steps, until the first termination alarm is reset to a non-triggered state and/or a new termination alarm $A_2$ is triggered. The following steps monitor the second condition $C=a_2 \cdot C_{th}$ which triggers the second termination alarm $A_2$.

The first termination alarm is thus triggered when the current computational complexity reaches a certain percentage of the threshold value, for example when $C=0.7 \times C_{th}$ (corresponding to a percentage of 70%). At this time, the algorithm introduces the first metric parameter $q_1$ which will be considered in the subsequent decoding steps until the next termination alarm is triggered or the decoding is terminated. Specifically, the decoder switches to suboptimal decoding where a function $g^i(q_1)$ of the parameter $q_1$ is deduced from the weight metrics of each upcoming extended node stored in the stack (step 305 of FIG. 3). Nodes are then stored in the stack in an increasing order of their newly calculated weight metrics (310, 311). The generation of the child nodes and removal of the parent node from the stack (302 to 308) may continue considering this first parameterized metric using $q_1$ (305). In the meantime, the current complexity may be updated.

The second termination alarm may be triggered when the current decoding complexity still approaches the authorized one, for example when $C=0.9 \times C_{th}$. In this case, the receiver defines a second parameter $q_2 > q_1$ and switches again to parameterized decoding where this time the weight metrics for the generated tree nodes are reduced from $g^i(q_2)$ ($f^i(s_i) - g^i(q_2)$) in the new iterations of step 305.

It should be noted that the larger the value of $q_2$, the faster the convergence of the decoding process and the returning of the anticipated termination solution.

In addition, if the authorized computational complexity $C_{th}$ is significantly lower than the one necessary for decoding an information symbols vector, the number of termination alarms may be increased and the metric parameters $q_i$ may be defined to take large values to guarantee a fast decoding convergence even at the expense of an error performance penalty.

The monitoring of the second termination alarm may be based on a periodic checking of the second condition according to the same period q or a different period q'. The following description of FIG. 4 will be made with reference to same period q for illustration purpose only.

Accordingly, step 405 increments k and once the next period is reached (step 406), the complexity indicator C is computed in step 407 and the second condition $C=a_2 \cdot C_{th}$ is then checked in step 408, from the predefined value of $a_2$, the value of C computed in step 407 and the predefined value of $C_{th}$.

If the second condition is verified, the state of the first Termination alarm $A_1$ is set to a non-triggered state in step 409 and the state of the second Termination alarm $A_2$ is set to a triggered state. The metric of a child node will be thus computed taking into account the metric parameter $q_2$, in step 305 of FIG. 3. At this time, the decoder switches to suboptimal decoding by introducing the second metric parameter $q_2$ that is deduced from the metrics of the child nodes in the stack during the following decoding steps.

Accordingly, while the weight metrics until the triggering of a first alarm may be derived in an optimal way, the weight metrics corresponding to the upcoming visited child nodes will be computed sub-optimally by deducing the metric parameter $q_p$.

The metric $f^i(s_i)$ associated with a child node ($s_i$) computed in step 304 or 305 is determined from the weight metrics of the nodes in the tree comprised in the path from the root node $s_n$ to the current node $s_i$.

The triangular structure of matrix R reduces the search of the closest point to a sequential tree-search. Nodes in the tree represent the different possible values of the symbols $s_i$, where $s_i$ for $i=1, \ldots, n$ represent the real and imaginary components of the information vector $s_c$. A tree branch represents two consecutive nodes ($s_{i+1}$; $s_i$).

The weight metric $w_j(s_j)$ of a node at a level j of the tree can be determined as the Euclidean distance between the $j^{th}$ component of the vector $\tilde{y}$ representing the received signal and the vector ($s_n \ldots s_j$) comprising the node values of the tree from the root node $s_n$ to the node $s_j$ at level j according to equation (9):

$$f^j(s_j) = w_j(s_j) = \left| \tilde{y}_j - \sum_{k=j}^{n} R_{jk} s_k \right|^2 \quad (9)$$

The weight metric of equation (9) represents a metric for the branch ($s_{j+1}$; $s_j$). Due to the triangular structure of matrix R, the search for candidate lattice points is started from the component $s_n$. It should be noted that the cumulated weight $w(s_j)$ of a node $s_j$ represents the metric of the path $s^{(j)}$ (sum of the weight metrics $w_j(s_j)$ of the nodes in the tree comprised in the path $s^{(j)}$ from the root node $s_n$ to the node $s_j$). It is therefore equal to the sum over all weights for different nodes forming the path according to:

$$w(s_j) = \sum_{k=j}^{n} w_k(s_k).$$

Using this definition, the ML metric minimization of equation (8) is equivalent to search for the path in the tree having the least cumulated weight.

By using a modified computation of the weight metric $w(s_j)$, the verification of a predefined condition related to the complexity indicator (corresponding to the triggering of one of the termination alarm) causes the anticipation of the termination of the decoding process. Accordingly, instead of waiting for a termination alarm to be activated, the algorithm prepares progressively the ending of the decoding process as well as the solution to be returned.

In one embodiment, in response to the triggering of one termination alarm $A_p$ among the set of termination alarms, the weight metric of the child node in the level i of the decoding tree may be computed in step 305 by defining the function $g^i(q_p)$ for the termination alarm $A_p$ being monitored, as a multiplicative function, with a slope coefficient set as equal to the level i of the node in the tree, as follows:

$$g^i(q_p) = i \cdot q_p \qquad (11)$$

Accordingly, in step 305, the weight metrics for the child node $s_i$ being considered is defined according to the following equation:

$$w(s_i) = \sum_{j=i}^{n} w_j(s_j) - i \cdot q_p = \sum_{j=i}^{n} \left| \tilde{y}_j - \sum_{k=j}^{n} R_{jk} s_k \right|^2 - i \cdot q_p \qquad (12)$$

By taking account the metric parameter $q_p$ in the computation of the weight metric for the child node $s_i$, the decoding process and convergence time may be accelerated while reducing the overall decoding complexity.

The metric parameter $q_p$ may be determined according different approaches.

In one embodiment, the metric parameters $q_p$ may be defined deterministically for a deterministic anticipated termination and take any positive non-zero real value. As the choice of the metric parameters $q_p$ may impact both the convergence of the decoding algorithm as well as the overall decoding complexity, depending on the available hardware resources and real-time constraints, the metric parameters $q_p$ may be assigned small values to provide good error performance but higher decoding complexity, or large values offering lower complexity at the expense of an error rate performance penalty.

Alternatively, the metric parameters $q_p$ may be defined to foster an adaptive anticipated termination of the decoding method. More specifically, the first metric parameter $q_1$ may be defined from the noise level. The metric parameters $q_p$ of the subsequently monitored termination alarms (with $2 \le p \le N$, and N designating the number of predefined termination alarms) may be deterministically selected such that $q_1 \le q_2 \le \ldots \le q_N$.

In particular, the first metric parameter $q_1$ corresponding to the first monitored alarm $A_1$ may be defined as:

$$b = \sigma^2 \log\left(\frac{4}{\pi \sigma^2}\right) \qquad (13)$$

where $\sigma^2$ is the variance of the MIMO channel additive noise.

Accordingly, the definition of the first metric parameter impacts takes into account the noise level which impacts the overall decoding complexity and convergence delay.

In still another embodiment, the metric parameters $q_p$ may be defined to foster an adaptive progressive anticipated termination of the decoding method. More specifically, the first metric parameter $q_1$ may be selected adaptively from the noise level (in particular according to equation (13)) while at least some of the metric parameters $q_p$ successively monitored (with $2 \le q \le N$, and N designating the number of predefined termination alarms) may be defined as a linear function of $q_1$, the linear function used to defined the metric parameter $q_p$ depending on a slot parameter $a_p$ representing a real number strictly higher than 1 (for p comprised in the interval [2; N] with N designating the number of predefined termination alarms):

$$q_p = a_p \cdot q_1 + b_p \qquad (14)$$

In particular the intercept coefficient $b_p$ may be equal to zero such that:

$$q_p = a_p \cdot q_1 \qquad (15)$$

The slot coefficients $a_p$ may be selected such that the following condition is satisfied:

$$q_1 \le q_2 \le \ldots \le q_N.$$

In yet another embodiment, for at least some of the alarms, the metric parameters $q_p$ (with $2 \le q \le N$, and N designating the number of predefined termination alarms) may be defined as a linear function of previously triggered alarm $q_{p-1}$, the linear function used to defined the metric parameter $q_p$ depending on an intercept coefficient $d_p$, and a slot parameter $c_p$ representing a real number strictly higher than 1:

$$q_p = c_p \cdot q_{p-1} + d_p \qquad (16)$$

In particular, the slope coefficient $c_p$ may be set as a strictly negative coefficient ($c_p < 0$) and the intercept coefficient may be selected such as to satisfy the condition $q_1 \le q_2 \le \ldots \le q_N$.

It should be noted that the invention may be applied to any type of sequential decoders, whatever the method used to generate the child nodes in step 302 and/or the selection criteria of child nodes to be inserted in the stack in step 309. In one embodiment, step 309 may include only selecting the set of child nodes that are included in a sphere of radius $C_s$ (the sphere constraint is expressed in inequality ($\|\tilde{y} - Rs\|^2 \le C_s^2$), as implemented in the SB-stack decoder. This involves that only the nodes having a value that is comprised in the interval $I_i = [b_{inf,i}; b_{sup,i}]$ are visited, where $b_{inf,i}$ and $b_{sup,i}$ depend on a sphere radius are stored in the stack. An interval is determined for each node representing a component of a symbol of the signal to be decoded. Specifically, the search interval $I_i$ for each detected symbol $s_i$ such that $b_{inf,i} \le s_i \le b_{sup,i}$ may be defined by the following boundaries:

$$b_{inf,i} = \left\lceil -\sqrt{\frac{T_i}{p_{ii}}} + S_i \right\rceil \qquad (18)$$

$$b_{sup,i} = \left\lfloor \sqrt{\frac{T_i}{p_{ii}}} + S_i \right\rfloor \qquad (19)$$

Where:

$$p_{ii} = R_{ii}^2 \text{ with } i = 1, \ldots, n \qquad (20)$$

$$p_{ij} = \frac{R_{ij}}{R_{ii}} \text{ with } j = l+1, \ldots, n$$

$$S_i = \rho_i + \sum_{j=i+1}^{n} p_{ij} \xi_j$$

$$T_i = C_s^2 - \sum_{l=i+1}^{n} p_{ll} \left( \xi_l + \sum_{j=l+1}^{n} p_{lj} \xi_j \right)^2 = T_{i-1} - p_{ii}(S_i - s_i)$$

Each child node is thus selected as a component of a candidate lattice point only if the node value of the child node is comprised in the search interval. Hence, the number of visited nodes during the decoding process depends then on the interval $I_i$ for each symbol $s_i$, the boundaries of the search interval depending on the sphere radius $C_s$.

The invention may also apply to other types of sequential decoders such as the zigzag decoder as described in patent application EP No 14306517.5. The zigzag decoder uses a stack, similarly to the SB-stack decoder, but instead of searching the candidate lattice points in a sphere, in step 302, the zigzag decoding algorithm generates at most three child nodes comprising a reference child node of the current node determined from the vector representing the received data signal, a first neighbor child node determined by subtracting a positive integer parameter from the value of the reference node, and a second neighbor child node determined by adding the positive integer parameter to the value of the reference child node. Child nodes are selected in step 309 among the three child nodes. The selected child node can then be stored in a stack similarly to the SB-stack decoder together with their respective metric, the stack being then reordered by increasing order of the node metrics. The top node of the stack, thus obtained, is selected as the new current node to iterate the recursive search operation.

Figure 5:
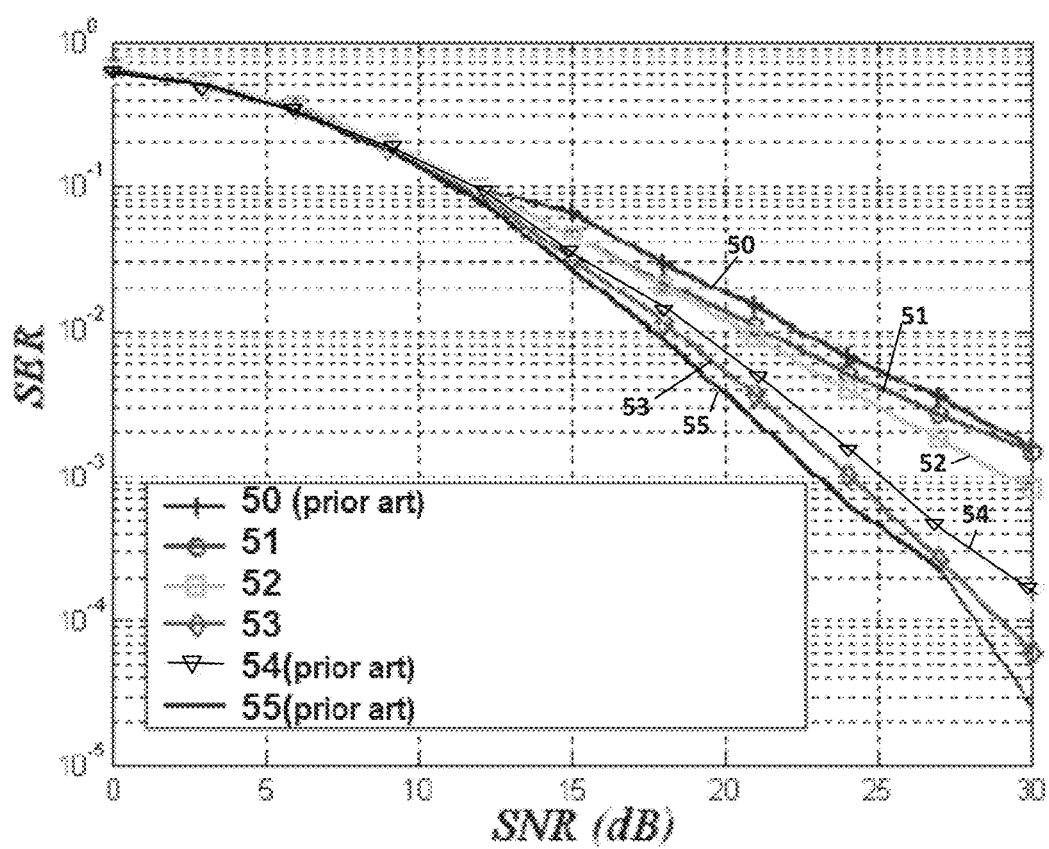
FIG. 5 is a diagram illustrating the Symbol Error Rate obtained with a decoder according to certain embodiments, in a 2×2 MIMO communication system, depending on the Signal-to-Noise Ratio (SNR)
Figure 6:
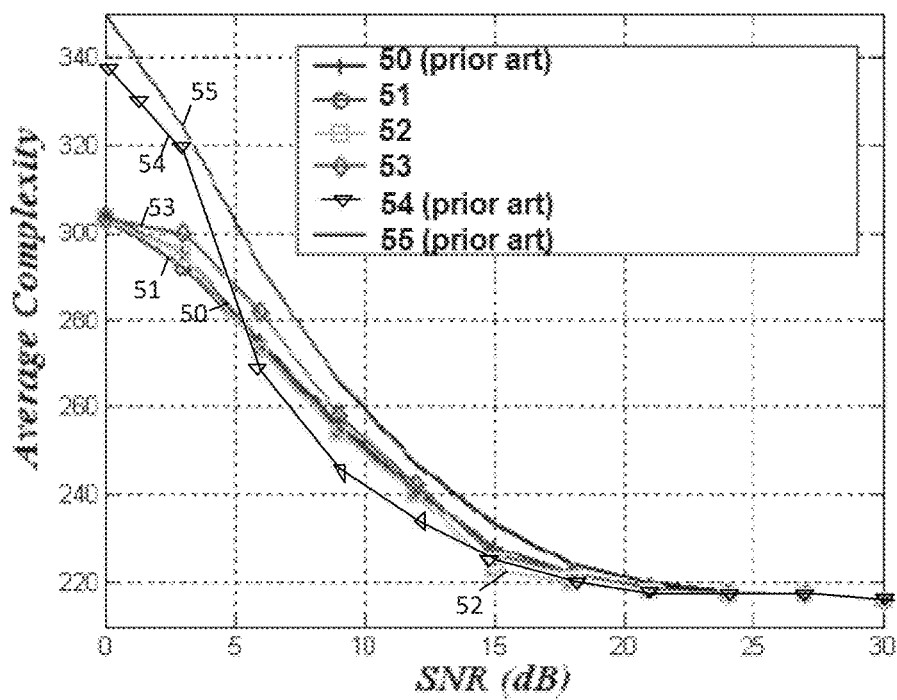
FIG. 6 is a diagram illustrating the total complexity obtained with a decoder according to certain embodiments, in a 2×2 MIMO communication system, depending on the Signal-to-Noise Ratio (SNR)

FIGS. 5 and 6 respectively illustrate the Symbol Error Rate (SER) and the total computational obtained for a simulation of the different termination approaches including a conventional ZF-DFE termination approach (Curve 50) in a 2×2 MIMO communication system ($n_t$=2 and $n_r$=2) using spatial multiplexing and 16-QAM modulation, and comprising a sphere decoder over 105 channel realizations.

Figure 7:
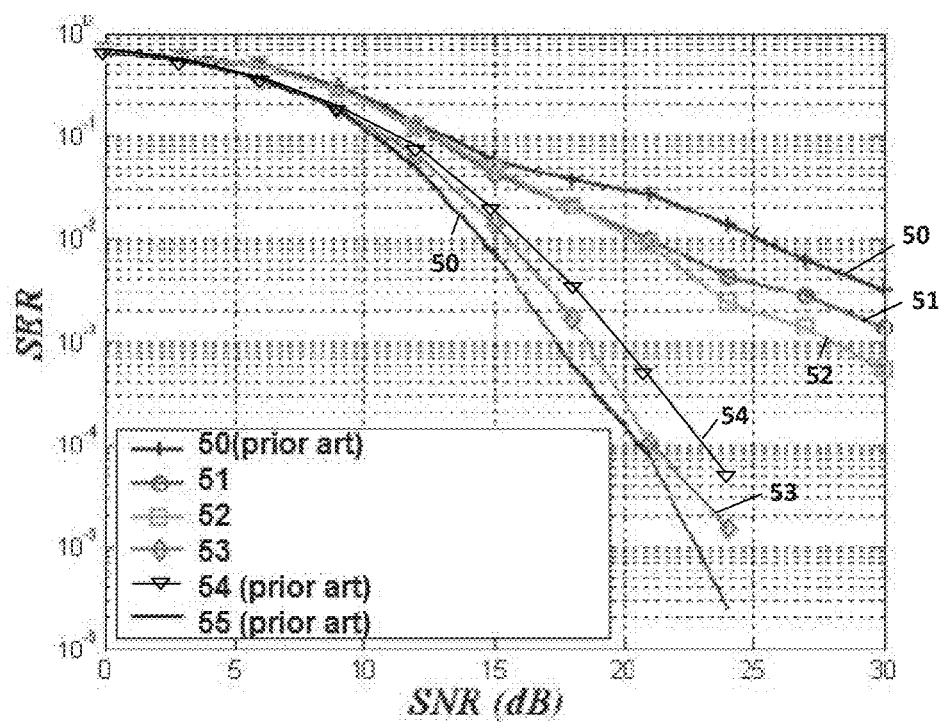
FIG. 7 is a diagram illustrating the Symbol Error Rate obtained with a decoder according to certain embodiments, in a 4×4 MIMO communication system, depending on the Signal-to-Noise Ratio (SNR)

FIG. 7 illustrates the Symbol Error Rate similarly to FIG. 5 but in a 4×4 MIMO communication system ($n_t$=4 and $n_r$=4), also using spatial multiplexing and 16-QAM modulation, and comprising a sphere decoder over 105 channel realizations.

FIGS. 5 to 7 correspond to an embodiment using two termination alarms $A_1$ and $A_2$ such that:

the alarm parameter $a_1$ of the first termination alarm is set to 0, 7 (the decoder switches to suboptimal parameterized decoding using a first metric parameter $q_1$ when the current complexity reaches 70% of the authorized one $C_{th}$).

the alarm parameter $a_2$ of the second termination alarm is set to 0, 9 (the decoder continues until reaching 90% of $C_{th}$, and then switches to suboptimal decoding with the second metric parameter $q_2$).

The simulation results of FIGS. 5 and 6 are based on the following parameter definitions:

For the deterministic termination (curve 51), the following value are used: $q_1$=0.1, $q_2$=5.

For the adaptive termination (curve 52), $q_1$ is selected according to equation (13) and $q_2$=5.

For the adaptive progressive termination (curve 53), $q_1$ is selected as defined in equation (13) while $q_2 = a_2 \cdot q_1$ with $a_2$=1.25.

The simulation results of FIG. 7 are based on the following parameter definitions:

For the deterministic termination (curve 51), the following value are used: $q_1$=0.1, $q_2$=10.

For the adaptive termination (curve 52), $q_1$ is selected according to equation (13) and $q_2$=10.

For the adaptive progressive termination (curve 53), $q_1$ is selected as defined in equation (13) while $q_2 = a_2 \cdot q_1$ with $a_2$=1.25.

In FIGS. 5 to 7:

Curve 50 corresponds to a conventional ZF-DFE termination;

Curve 51 corresponds to the deterministic anticipated termination embodiment of the invention;

Curve 52 corresponds to the deterministic anticipated termination embodiment of the invention;

Curve 53 corresponds to the deterministic anticipated termination embodiment of the invention;

Curve 54 corresponds to convention optimal ML detection; and

Curve 55 corresponds to conventional stack decoding using a fixed bias value for the computation of the weight metric.

FIGS. 5 and 6 illustrate the advantages of the anticipated termination method according to certain embodiments of the invention and in comparison to conventional approaches (curves 50, 54, and 55). It can be observed that the progressive termination embodiment (curve 53) offers a better symbol error rate. Specifically, it can be observed that the gain over a conventional ZF-DFE termination method, represented by curve 50, is 6.5 dB at a SER=$2 \times 10^{-3}$ and its loss compared to the conventional optimal ML detection (represented by curve 54) is limited to only 1 dB at the same SER.

By comparing the diagram of FIG. 5 (corresponding to $n_t$=2) with the diagram of FIG. 7 (corresponding to $n_t$=4), it can be observed that the performances of the anticipated termination according to the embodiments of the invention are all the more significant as the number of antennas increases.

In particular, FIG. 7 shows that the adaptive progressive provides a very significant error performance gain over the conventional termination approach. Although in average it requires larger decoding complexity than the two other techniques at low SNR regime, it provides a very significant error performance gain. For example at a SER=$3 \times 10^{-3}$, it offers a gain of 13 dB over the conventional ZF-DFE termination method.

Figure 8:
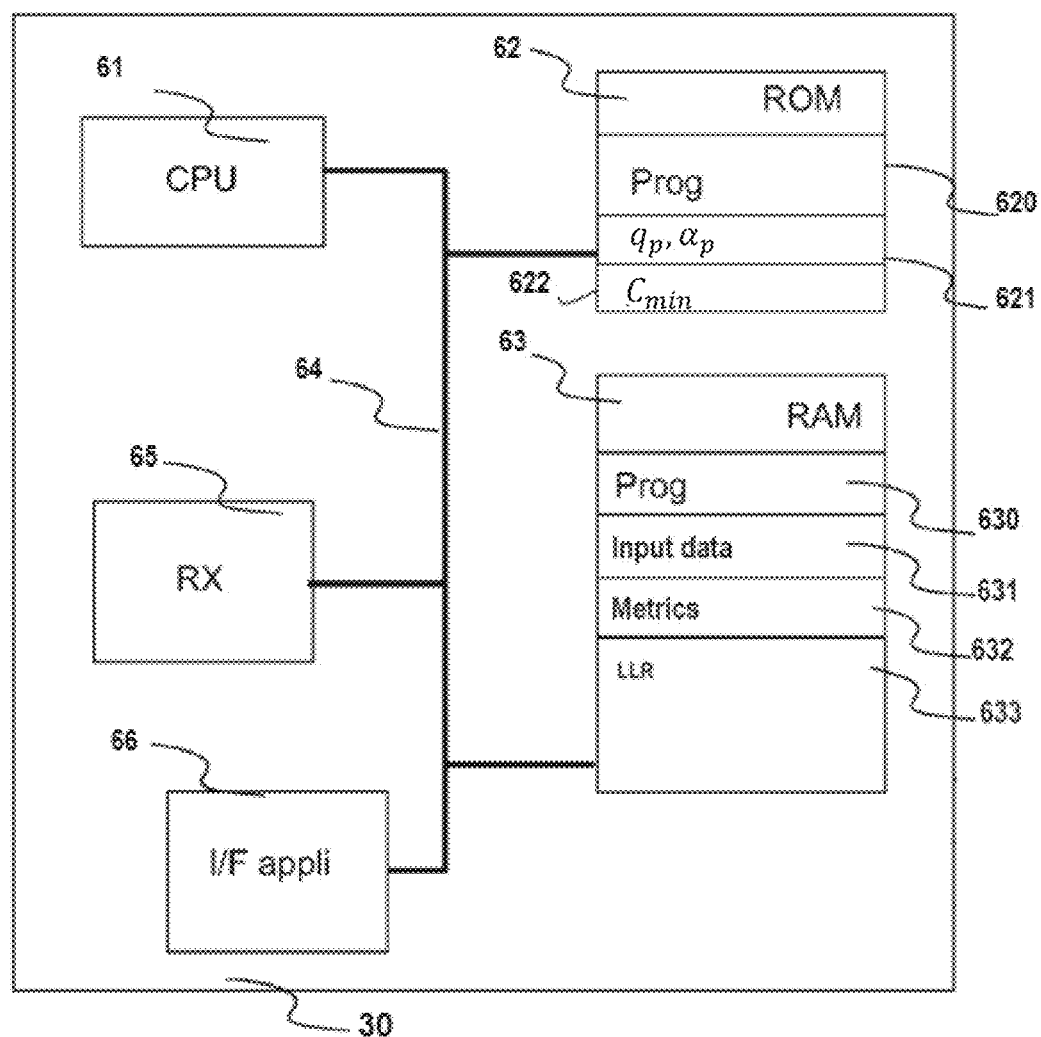
FIG. 8 schematically shows an exemplary hardware architecture of the decoder according to certain embodiments.

FIG. 8 represents an exemplary architecture of a space/time decoder 30 of the receiver 3 in a SB-stack embodiment of the invention. As shown, the space/time decoder 30 may include the following elements, which are linked together by a data and address bus 64:

a microprocessor 61 (or CPU), which is, for example, a digital signal processor (DSP);

a non-volatile memory 62 (or ROM, read-only memory);

a random access memory RAM 63;

an interface 65 for receiving input signals coming from the time/frequency converter;

an interface 66 for transmitting decoded data to the demodulator 31.

The non-volatile ROM memory 62 may include for example:

a register "Prog" 620;

at least some of the metric parameters $q_p$ when set deterministically, represented by block 621, such as all the parameters $q_p$ in the deterministic termination embodiment of the invention or the metric parameters $q_p$ for p comprised in [2, N] in adaptive or progressive termination embodiments of the invention;

the complexity threshold $C_{th}$, 622;

the alarm parameters $\alpha_p$, 623.

The algorithms for implementing the method according to this embodiment of the invention can be stored in the program 620. The CPU processor 41 may be configured to download the program 620 to the RAM memory and runs the corresponding instructions. Specifically, the CPU comprises instructions for determining estimated symbols representative of the transmitted symbols carried by the received signal, the estimated symbols being determined from the nodes of the decoding tree depending on the weight metric associated with each node, the nodes of the tree corresponding to a possible component of a symbol of said data signal, the weight metric associated with a node representing a function of the Euclidean distance between the signal received and the path between the root node of the decoding tree and the node.

The CPU further comprises instructions for monitoring the set of termination alarms (Ap), each termination alarm being triggered in response to the verification of the respective triggering condition defined for this termination alarm, the condition being related to the computational complexity indicator representing the current decoding computational complexity, and, in response to the triggering of one of the termination alarms, the decoder determines the weight metric of the child node being processed by reducing the Euclidean distance of a quantity corresponding to a function of the metric parameter associated with the triggered termination alarm.

The RAM memory 63 may include:

in a register Prog 630, the program run by the microprocessor 61 and downloaded in an active mode of the space/time decoder 30;

input data in a register 631;

data related to the nodes in a register 632;

likelihood probabilities or LLR in a register 634;

The data stored in the register 632 may include, for a node of the decoding tree, metric parameters associated with this node (path from the root to said node, and/or the depth in the tree).

More generally, the decoding techniques described herein may be implemented by various means. For example, these techniques may be implemented in hardware, software, or a combination thereof. For a hardware implementation, the processing elements of decoder can be implemented for example according to a hardware-only configuration (for example, in one or more FPGA, ASIC or VLSI integrated circuits with the corresponding memory) or according to a configuration using both VLSI and DSP.

While embodiments of the invention have been illustrated by a description of various examples, and while these embodiments have been described in considerable detail, it is not the intent of the applicant to restrict or in any way limit the scope of the appended claims to such detail. Particularly, the invention is not limited to a particular type of sequential decoder. More generally the invention may apply to any sequential decoder using a best-first tree-search to search for candidate lattice vectors such as Stack decoders, Fano decoders, decoders implementing the M-algorithm, the SB-Stack and the Zigzag Stack decoder (as disclosed in EP No 14306517.5).

Further, although the invention has been described in relation with certain embodiments where the alarm parameters $\alpha_p$ are set deterministically, the invention may be applied to any type of predetermination of the alarm parameters $\alpha_p$. Similarly, although the use of a linear function or multiplicative function $g^i(q_p)$ presents certain advantages, the invention is not limited to such type of functions. Also, even if certain embodiments have been described to determine the metric parameters $q_p$ for each termination alarm $A_p$, the invention is not limited to such embodiments. For example, in certain approaches, the metric parameter $q_p$ may be determined as a function of the metric parameter $q_{p-1}$ used for the previous termination alarm $A_{p-1}$, or more generally as a function of at least some of the previous metric parameters $(q_{p-1}, \ldots, q_1)$.

It should be also noted that, although FIG. 4 has been illustrated with a fixed period T for the periodic monitoring of the termination alarms, alternatively the monitoring of the termination alarms may be performed at a different frequency or the period T may selectively vary over the decoding process. In particular, the termination alarm monitoring period T may be changed in response to the triggering of an alarm $A_p$.

Further, the various embodiments of the invention are not limited to particular types of detection, and apply both to hard and soft detection.

Further, while some embodiments of the invention have been described in relation to wireless MIMO systems involving a single pair of transmitter/receiver, it should be noted that the invention is not limited to such an application. The invention may be integrated in any receiver device operating in any linear communication system characterized by a linear representation of the channel output. The communication system may be wired, wireless or optical fiber-based accommodating single or multiple users, using single or multiple antennas, and single or multi-carrier communication techniques. For example, the present invention may be integrated in a receiver device implemented in a wireless distributed MIMO system. Distributed MIMO may be used for example in cellular communications applied in 3G, 4G, LTE, and future 5G standard. Cooperative communications applied for example in ad-hoc networks (wireless sensor networks, machine-to-machine communications, internet of things, etc) are also examples of distributed MIMO systems. In addition to wireless networks, the present invention may be integrated in optical receiver devices implemented in optical fiber-based communication systems such as Polarization Division Multiplexing-OFDM (PDM-OFDM) systems.

Further, the invention is not limited to communication devices and may be integrated in signal processing devices such as electronic filters of finite impulse response (FIR) used in audio applications like audio crossovers and audio mastering. Accordingly, some embodiments may be used to determine an estimate of an input sequence, given an output sequence of a FIR filter of order M.

In another application, methods, devices and computer program products according to some embodiments of the invention may be implemented in a Global Navigation Satellite System (GNSS), such as IRNSS, Beidou, GLONASS, Galileo; GPS comprising for instance at least a GPS receiver for estimating positioning parameters using for example carrier phase measurements.

Further, methods, devices and computer program products according to some embodiments of the invention may be implemented in cryptographic systems for determining estimates on private secret values used in a cryptographic algorithm for encrypting/decrypting data or messages during their storage, processing or communication. In lattice-based cryptography applications, data/messages are encrypted in the form of lattice points. The decryption of such encrypted data may be advantageously performed according to some embodiments of the invention, enabling for a high probability of success recovery of secret values with a reduced complexity.

The invention claimed is:

1. A sequential decoder for decoding a data signal received through a transmission channel in a communication system, said sequential decoder comprises at least a memory and one or more processors, the one or more processors being configured to:

determine estimated symbols representative of the transmitted symbols carried by the received signal, said estimated symbols being determined from nodes of a decoding tree based on a weight metric associated with each of said node, each node of the decoding tree corresponds to a given level of the decoding tree, monitor a termination alarm depending on a current decoding computation complexity, said termination alarm being associated with a metric parameter, and reduce the weight metric of each node of the decoding tree by a quantity corresponding to a function of said metric parameter associated with said termination alarm, in response to a triggering of said termination alarm, said function depending on a level of said node in said decoding tree.

2. The sequential decoder of claim 1, wherein the one or more processors is further configured to monitor a set of termination alarms depending on the current decoding computation complexity, each termination alarm being associated with a metric parameter, and wherein, in response to the triggering of at least one termination alarm, reduce the weight metric of each node of the decoding tree by a quantity corresponding to a function of the metric parameter associated with said triggered termination alarm.

3. The sequential decoder of claim 1, wherein the decoding tree comprises a root node and the weight metric associated with a node is a function of an Euclidean distance between the signal received and a path between the root node of the decoding tree and said node.

4. The sequential decoder of claim 2, wherein each termination alarm depends on a triggering condition related to a computational complexity indicator representing the current decoding computation complexity, the triggering condition associated with a given termination alarm comprising a comparison of said computational complexity indicator with a portion of a predefined complexity threshold.

5. The sequential decoder of claim 4, wherein said complexity indicator represents a number of multiplicative operations.

6. The sequential decoder of claim 5, wherein each triggering condition comprises determining if the computational complexity indicator reaches said portion of said predefined decoding computational complexity threshold.

7. The sequential decoder of claim 6, wherein said quantity associated with a given termination alarm is a linear function of the metric parameter, the linear function having a slope parameter, the slope parameter of the linear function corresponding to the level of the tree of the node.

8. The sequential decoder of claim 7, wherein the metric parameters of said set of termination alarms are non-zero positive value parameters.

9. The sequential decoder of claim 8, wherein said set of termination alarms comprise a first termination alarm being monitored, a metric parameter of the first monitored termination alarm being defined from a noise level.

10. The sequential decoder of claim 8, wherein a termination alarm is triggered after a previously triggered alarm associated with a metric parameter having a value, the metric parameter of each termination alarm being determined from the value of the metric parameter of the previously triggered alarm.

11. The sequential decoder of claim 2, wherein a termination alarm is triggered after a previously triggered alarm having a metric parameter, and wherein for at least some of said set of termination alarms, the metric parameter of the termination alarm is determined as a linear function of the metric parameter of the previously triggered alarm.

12. The sequential decoder of claim 2, wherein a termination alarm is triggered after a previously triggered alarm associated with a metric parameter having a value, and wherein for at least some of said set of termination alarms, the metric parameter associated with a given termination alarm is determined to be superior or equal to the value of the metric parameter of the previously triggered alarm.

13. The sequential decoder of claim 2, wherein a first termination alarm is triggered and wherein for at least some of said set of termination alarms, the metric parameter of the termination alarm is determined as a linear function of the metric parameter of the first triggered alarm.

14. The sequential decoder of claim 2, wherein said set of termination alarms comprises a total number of termination alarms, the total number of termination alarms being a function of a predefined complexity threshold ($C_{th}$).

15. The sequential decoder of claim 1, wherein the decoder performs a decoding method which is a stack decoding method comprising iteratively constructing the decoding tree, said construction of the decoding tree comprising implementing at least one iteration of the following, for a current node of tree stored in a top of a stack:

generating a set of child nodes of the current node from a vector representing the received data signal, and for each child node determining said weight metric, removing the current node from said stack;

storing in said stack selected nodes among said set generated child nodes, each child node being stored in the stack in association with node information comprising said weight metric, the nodes in the stack being ordered by increasing values of metrics;

selecting the top node of said stack as the current node;

said estimation of symbols representative of the transmitted symbols carried by the received signal being determined from the node information stored in said stack.

16. A receiver for receiving and decoding an encoded data signal, wherein the receiver comprises a sequential decoder according to claim 1 for decoding said data signal.

17. A mobile device capable of transmitting and receiving data in a wireless communication network, wherein the mobile device comprises a receiver according to claim 16 for receiving a data signal.

18. A method for sequential decoding of a data signal received through a transmission channel in a communication system, said method comprising determining estimated symbols representative of the transmitted symbols carried by the received signal, said estimated symbols being determined from nodes of a decoding tree based on a weight metric associated with each of said node, each node of the decoding tree corresponds to a given level of the decoding tree, wherein the method further comprises monitoring a termination alarm depending on a current decoding computation complexity, said termination alarm being associated with a metric parameter, said step of determining estimated symbols comprising, in response to a triggering of said termination alarm, reducing the weight metric of each node of the decoding tree by a quantity corresponding to a function of the metric parameter associated with the termination alarm, said function depending on a level of said node in said decoding tree.

19. The method of claim 18, wherein the method further comprises monitoring a set of termination alarms depending on the current decoding computation complexity, each termination alarm being associated with a metric parameter, and wherein, in response to the triggering of at least one termination alarm, said step of determining estimated symbols comprises reducing the weight metric of each node of the decoding tree by a quantity corresponding to a function of the metric parameter associated with said triggered termination alarm.

20. A computer program product comprising computer instructions stored on a non-transitory computer readable storage medium for sequential decoding of a data signal received through a transmission channel in a communication system by determining estimated symbols representative of the transmitted symbols carried by the received signal, said estimated symbols being determined from nodes of a decoding tree based on a weight metric associated with each of said node, each node of the decoding tree corresponds to a given level of the decoding tree, the computer instructions when executed by a processor, cause the processor to monitor a termination alarm depending on current decoding computation complexity, the termination alarm being associated with a metric parameter, and determine estimated symbols by reducing a weight metric of each node of the decoding tree by a quantity corresponding to a function of the metric parameter associated with the termination alarm, in response to a triggering of the termination alarm, said function depending on a level of said node in said decoding tree.

* * * * *